(12) United States Patent
Horie et al.

(10) Patent No.: US 6,172,998 B1
(45) Date of Patent: *Jan. 9, 2001

(54) SEMICONDUCTOR LASER DIODE

(75) Inventors: Hideyoshi Horie; Toshinari Fujimori; Satoru Nagao; Hideki Goto, all of Ushiku (JP)

(73) Assignee: Mitsubishi Chemical Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/971,719

(22) Filed: Nov. 17, 1997

(30) Foreign Application Priority Data

Nov. 18, 1996 (JP) .................................. 8-306340

(51) Int. Cl.$^7$ ....................................... H01S 3/19
(52) U.S. Cl. ............................... 372/46; 372/45
(58) Field of Search ............... 437/129; 372/45, 372/46, 50, 96

(56) References Cited

U.S. PATENT DOCUMENTS 5,566,198 * 10/1996 Horie et al. .............. 372/46
5,587,334 * 12/1996 Naito et al. .............. 437/129

FOREIGN PATENT DOCUMENTS 0 695 007 * 1/1996 (EP) .

OTHER PUBLICATIONS

Shima et al., *IEEE Journal of Selected Topics in Quantum Electronics*, 1(2):102–109 (1995). (Jun.).*
Shima et al., *International Conference on Solid State Devices & Materials*, pp. 961/962, Aug. 23–Aug. 26, 1994, Japan.*
O. Imafuji et al., *IEEE Journal of Quantum Electronics*, 29(6):1889–1894 (1993). (Jun.).*
Shima et al. "0.78 and 0.98 micrometer Rigde–Waveguide Lasers Buried with AlGaAs Confinement Layer Selectively Grown by Chloride–Assisted MOCVD", IEEE Journal of Selected Topics in Quantum Electronics. 1(2):102–109, Jun. 1995.*

* cited by examiner

Primary Examiner—James W. Davie
(74) Attorney, Agent, or Firm—David G. Conlin; Peter F. Corless; Edwards & Angell LLP

(57) ABSTRACT

The present invention relates to a semiconductor laser diode comprising a GaAs substrate and at least a first conduction-type clad layer, an active layer containing In, Ga and As as component elements, a second conduction-type first clad layer, a current block layer and a second conduction-type second clad layer which are deposited on the substrate in order, wherein a current injection region is formed by said current block layer and said second conduction-type second clad layer, the effective refractive index step $\Delta n_{eff}$ in the horizontal direction is from $2.5\times10^{-3}$ to $5.0\times10^{-3}$ at the emission wavelength, and the width W of the current injection region is from 1.5 to 2.5 $\mu$m. The semiconductor laser diode of the present invention is suited for uses where high output and long life-time are required, such as excitation light source for optical fiber amplifiers.

10 Claims, 10 Drawing Sheets

SEMICONDUCTOR LASER DIODE

BACKGROUND OF THE INVENTION

The present invention relates to a semiconductor laser diode, and more particularly, relates to a semiconductor laser diode suited for uses where high power output and long life-time are required, such as excitation light source for optical fiber amplifiers.

Development of optical information-processing techniques and optical communication techniques in recent years is remarkable. It is to a fact, for instance, the realization of many advanced technical achievements such as high-density storage system by a magnet-optical disc and bidirectional communication by optical fiber networks. Especially in the field of communication, many studies are being made on large-capacity optical fiber transmission lines which can genuinely cope with the coming age of multimedia communication and rare earth (such as $Er^{3+}$, etc.)-doped optical fiber amplifiers (EDFA) for amplification of signals having flexibility for such transmission system. As a matter of course, development of a high power output and long life-time semiconductor laser diode, which is an essential component of EDFA, is looked forward.

There exist, in principle, three different emission wavelengths of a semiconductor laser diode applicable to EDFA, that is, 800 nm, 980 nm and 1,480 nm.

It is known that, when viewed from the standpoint of the amplifier itself, excitation at 980 nm is desirable in consideration of gain, noise figure and other factors. Since the important key point of the laser having this wavelength of 980 nm is coupling efficiency to the optical fibers, it is desired that the laser output especially its transverse mode should be stable even if laser diode has changing of current injection, temperature, reflection from the fiber. Further, being used as an excitation light source, this laser diode is required to realize high output and long life-time.

There is a request for application of this laser as SHG light source in this range of wavelength, and thus development of a high-performance laser for use in the above-mentioned and various other fields of application has been desired.

However, the hitherto reported semiconductor laser diodes having a wavelength around 980 nm, especially diodes having a structure designed for coupling to an optical system have involved the following problem. In the high-output region, for example, in the light output region of around 150 to 200 mW, there is observed a phenomenon of non-linearity, called "kink", in the current and light output characteristics. This is attributable to unstability of the transverse mode due to various causes and detrimental to stable coupling to fibers. This kink is also observed from a comparatively low light output region in the lasers having the similar layer structures, when the layer composition or thickness slightly differs. The above phenomenon is even seen from a particularly low light output region when the temperature is high.

As a result of extensive studies for solving the above problem, it has been found that in a semiconductor laser diode with an InGaAs system having an index guided structure, the refractive index step in the horizontal direction and the width W of the current injection region for narrowing current injection pass necessary for laser oscillation have a strong correlation with the kink level and the temperature characteristics, and by optimizing the defined ranges of these parameters and their combination, laser diode with both a high kink level and good temperature characteristics has been realized. On the basis of the above, the present invention has been achieved.

SUMMARY OF THE INVENTION

The object of the present invention is to reconcile a high kink level and high temperature characteristics and to provide a semiconductor laser diode having a kink level of about 250 mW at around room temperature and a center wavelength of around 980 nm.

To accomplish the aim, in a fist aspect of the present invention, there is provided a semiconductor laser diode comprising a GaAs substrate, and at least a first conduction-type clad layer, an active layer containing In, Ga and As as component elements, a second conduction-type first clad layer, a current block layer and a second conduction-type second clad layer which are deposited on the GaAs substrate, wherein a current injection region is formed by the current block layer and the second conduction-type second clad layer, the effective refractive index step $\Delta n_{\textit{eff}}$ in the horizontal direction is from $2.5 \times 10^{-3}$ to $5.0 \times 10^{-3}$ at the emission wavelength, and the width W of the current injection region is from 1.5 to 2.5 μm.

DETAILED DESCRIPTION OF THE INVENTION

The present invention is described in detail below. First, the effective refractive index which is the keynote of the present invention is explained in detail.

Figure 1:
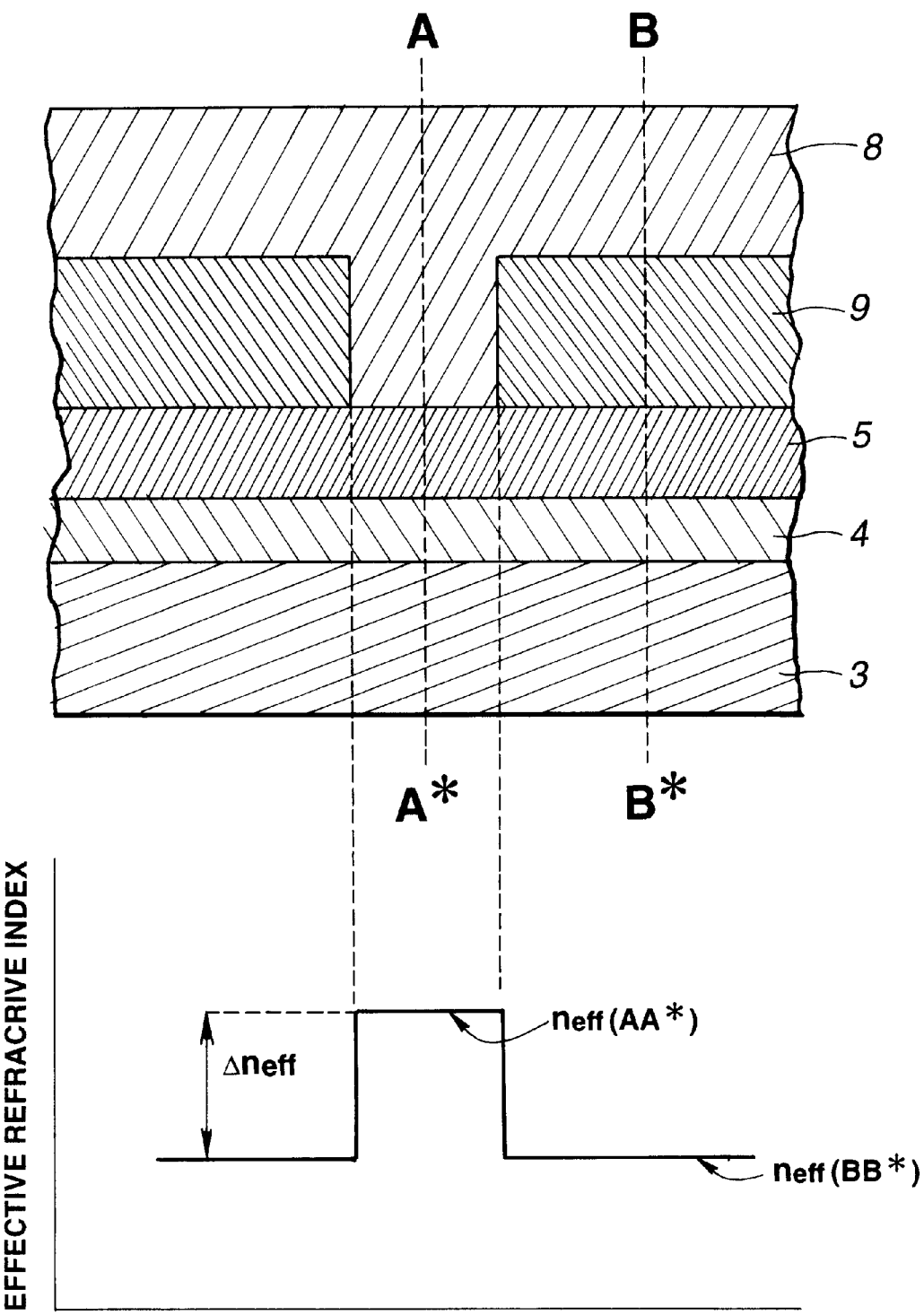
FIG. 1 is an explanatory view illustrating the effective refractive index step $\Delta n_{\textit{eff}}$ in the semiconductor laser diode according to the present invention.

Referring to FIG. 1, there is shown a schematic sectional view of a semiconductor laser diode for explaining the effective refractive index step $\Delta n_{\textit{eff}}$ in the present invention. The laser diode structure used in the embodiment of FIG. 1 is a structure called the index guided structure in which the horizontal transverse mode of laser light is confined by the refractive index step. In the structure, the stripes defining a current injection region are formed, and a refractive index step is produced between this current injection region and the outside thereof in the direction parallel to the active layer by the current block layers (9) with a low refractive index disposed on both sides of the current injection region.

In this case, the effective refractive index step $\Delta n_{eff}$ becomes approximately a function of the composition and thickness of each layer and the emission wavelength. Its theory and calculation method are described in H. C. Casey, Jr. and M. B. Panish: Heterostructure Lasers, Academic Press (1978), Part A, pp. 20–109, and Part B, pp. 156–276; and R. Ito and M. Nakamura: Fundamentals and Application of Semiconductor laser diodes (5th ed., Baifukan, Mar. 30, 1995), Chapters 3 and 5. The specific calculation method for the layer structure of the present invention is explained below.

In order to determine the effective refractive index step $\Delta n_{eff}$, the multilayer film composed of the first conduction-type clad layer (3), active layer (4), second conduction-type first clad layer (5) and second conduction-type second clad layer (8) is regarded as a slab waveguide in the current injection region (A—A* cross-section in FIG. 1), and the waveguide mode of the laser light propagated therethrough is calculated in terms of TE mode to determine the effective refractive index of the fundamental mode at the center wavelength. On the calculation of the waveguide mode, the thickness of the first conduction-type clad layer (3) and the thickness of the second conduction-type second clad layer (8) are approximated to be infinite. In case where the active layer is composed of a strained quantum well and optical guide layers, there is made an approximation in which the refractive index of the strained quantum well used in the calculation is substituted by the refractive index of the optical guide layer. The thus determined effective refractive index for the fundamental mode is represented by $n_{eff}(AA^*)$.

Then, similarly, the multilayer film composed of the first conduction-type clad layer (3), active layer (4), second conduction-type first clad layer (5), current block layer (9) and second conduction-type second clad layer (8) is regarded as slab waveguide for the outside of the current injection region (B—B* cross-section in FIG. 1), and the effective refractive index for the fundamental mode in the waveguide mode is determined and represented by $n_{eff}(BB^*)$. In the actual device structure, some additional layers such as an etching stop layer, etc. are usually provided beside those shown in FIG. 1, and in this case, $n_{eff}(AA^*)$ and $n_{eff}(BB^*)$ are determined for the multilayer film composed of all of the layers present between the first conduction-type clad layer (3) and the second conduction-type second clad layer (8) at the A—A* cross-section and the B—B *cross-section.

Also, in the actual device structure, the shape of the current injection region is not rectangular as shown in FIG. 1 but is usually reversed mesa, and in this case, $n_{eff}(AA^*)$ is determined for the inside of the narrowest portion of the current injection region while $n_{eff}(BB^*)$ is determined for the outside of the widest portion of the current injection region. From the thus determined $n_{eff}(AA^*)$ and $n_{eff}(BB^*)$, the effective refractive index step is given:

$$\Delta n_{eff} = n_{eff}(AA^*) - n_{eff}(BB^*).$$

In the present invention, the above effective refractive index step $\Delta n_{eff}$ in the horizontal direction satisfies the following formula (I), thereby ensuring both high kink level stability and high temperature stability.

$$2.5 \times 10^{-3} \leq \Delta n_{eff} \leq 5.0 \times 10^{-3} \quad (I)$$

The "horizontal direction" referred to in the present specification is the direction which is orthogonal to both the deposition direction of each layer and the light emission direction.

The optimum effective refractive index step $\Delta n_{eff}$ differs depending on the semiconductor laser diode properties required by the emission wavelength and the field of application. Since the semiconductor laser diode of the present invention has an active layer containing In, Ga and As, the above formula (I) defines the optimal range of the effective refractive index step $\Delta n_{eff}$ at an emission wavelength in the range of around 900 to 1,200 nm, preferably around 900 to 1,100 nm from such an active layer.

The semiconductor laser diode of the present invention has a refractive index guided mechanism and a layer structure comprising, as deposited on a GaAs substrate in order, at least a first conduction-type clad layer, an active layer, a second conduction-type first clad layer, a current block layer and a second conduction-type second clad layer. A planer-type laser can be obtained by forming whole of this layer structure with semiconductor materials, and this laser diode has excellent thermal conductivity and stability at high temperature.

Figure 2:
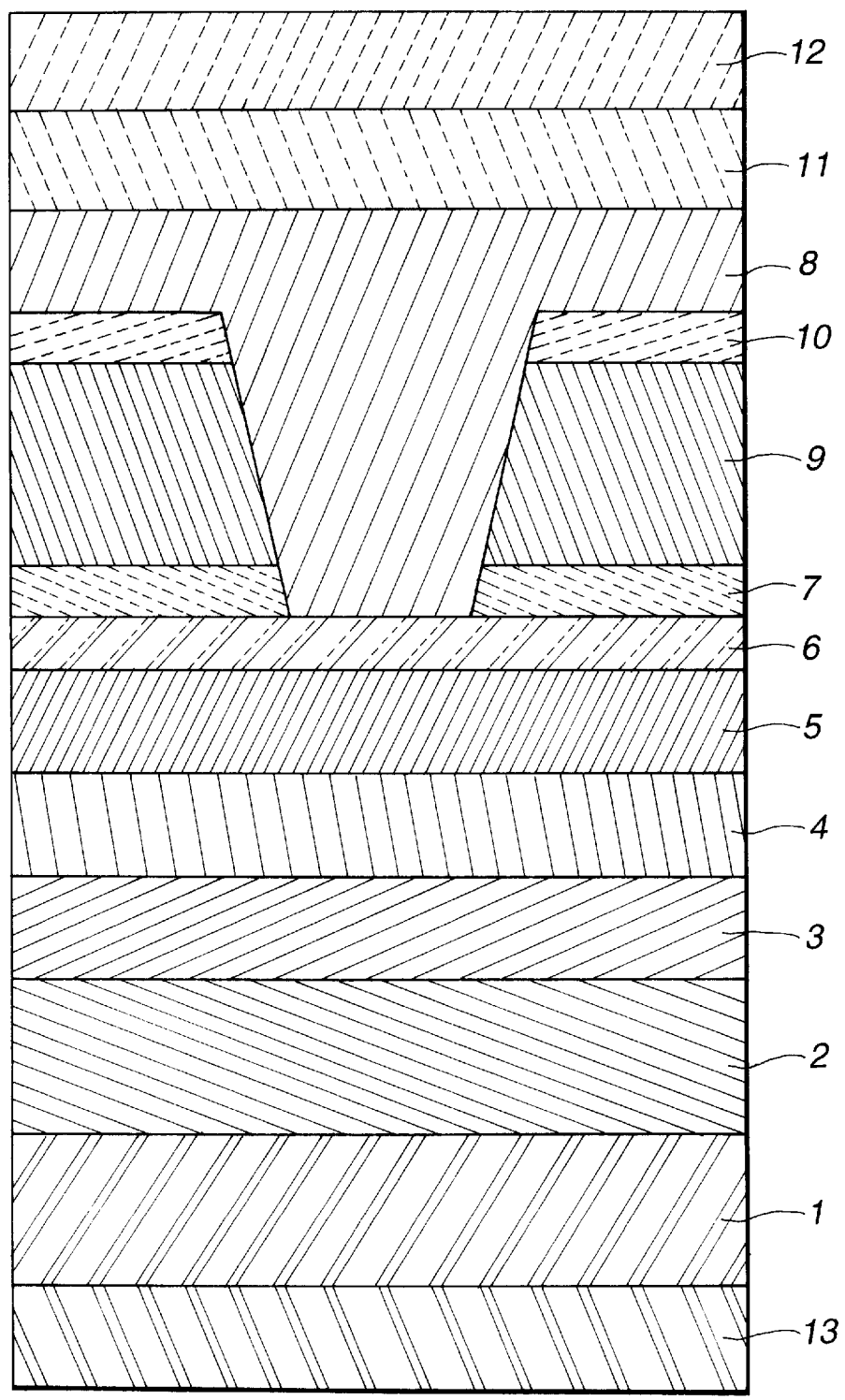
FIG. 2 is a schematic cross sectional view illustrating of a groove-type epitaxial structure of the semiconductor laser diode according to the present invention.

FIG. 2 is a schematic cross sectional view illustrating a groove-type semiconductor laser diode as a preferred embodiment having an epitaxial structure according to the present invention.

In the semiconductor laser diode of the present invention, a GaAs single crystal substrate is used for the reason of good lattice matching. Such a GaAs single crystal substrate (1) is usually cut out from a bulk crystal thereof.

It is preferred that the buffer layer (2) is disposed on the substrate for relieving the imperfectness of the substrate bulk crystal and for facilitating formation of the epitaxial thin films having the same crystallographic axis. This buffer layer (2) is preferably made of the same compound as used for the substrate, usually GaAs being used.

The first conduction-type clad layer (3) is usually composed of a material having a smaller refractive index than the active layer (4). In case where GaAs is used for the buffer layer (2), usually an AlGaAs material ($Al_yGa_{1-y}As$) is used and the concentration thereof is properly selected so that the refractive index satisfies the above-mentioned conditions.

The material and structure of the active layer (4) are properly selected in consideration of the desired emission wavelength and output. The active layer (4) is composed of a material containing at least In, Ga and As, usually $In_qGa_{1-q}As$ ($0<q<1$), and various types of quantum well structure (such as SQW and MQW) can be used. Usually, an optical guide layer is jointly used in a quantum well structure. As the optical guide layer structure, there can be used, for example, a structure in which the optical guide layers are disposed on both sides of the active layer (SCH structure), and a structure in which the refractive index is varied continuously by gradually changing the composition of the optical guide layer (GRIN-SCH structure). The preferred optical guide layer composition in the present invention is $Al_xGa_{1-x}As$ ($0 \leq x \leq 1$).

The second conduction-type first clad layer (5) is composed of a material having a smaller refractive index than the active layer (4). The refractive index of the second conduction-type first clad layer (5) and that of the first conduction-type clad layer (3) are usually equalized.

Therefore, an AlGaAs material is usually used as the material of the second conduction-type first clad layer (5), too, and its concentration is usually the same as that of the first conduction-type clad layer (3). In this structure, the second conduction-type first clad layer (5) is equivalent to a layer composed of $Al_wGa_{1-w}As$.

In FIG. 2 are shown two types of etching stop layers and a cap layer. These layers are effective to precise and easy fabrication of the current injection region and are adopted in the preferred embodiments of the present invention.

The second etching stop layer (6) is composed of an $Al_aGa_{1-a}As$ ($0 \leq a \leq 1$) material, but usually GaAs is preferably used. With such a second etching stop layer, the formation of the second conduction-type second clad layer can be accomplished maintaining high crystallinity when the second conduction-type second clad layer, etc., are regrown especially with an AlGaAs material by MOCVD method or the like. It is preferred that the thickness of the second etching stop layer (6) is not less than 2 nm.

The first etching stop layer (7) is preferably composed of the composition of $In_bGa_{1-b}P$ ($0 \leq b \leq 1$). In case where GaAs is used as substrate material as in the present invention, usually a lattice matched system with b=0.5 is used. The thickness of the first etching stop layer is usually not less than 5 nm, preferably not less than 10 nm, the upper limit being preferably 100 nm. When the layer thickness is less than 5 nm, it may become impossible to prevent etching due to irregularity of layer thickness. The reason of the upper limit of the thickness is that the thermal conductivity of $In_{0.5}Ga_{0.5}P$ is lower than that of AlGaAs. A strained system with b=0 or b=1 may be used depending on the layer thickness. The layer thickness of such a strained system should be from one monolayer to 15 nm, preferably up to 10 nm. With such a thin layer thickness, pseudomorphic condition can be kept and there is no need to kept lattice match.

The cap layer (10) is used as a protective layer for the current block layer (9) in the first growth and also serves for facilitating the growth of the second conduction-type second clad layer (8). The cap layer is partly or wholly removed before the diode structure is obtained.

Since it is required that the current block layer (9) literally blocks the current, that is, substantially inhibit the flow of carrier, conduction-type thereof is preferably either equalized with the first conduction-type clad layer or a nominally undoped type thereof. It is also preferred that this layer has a smaller refractive index than the second conduction-type second clad layer (8) which is usually composed of $Al_yGa_{1-y}As$ ($0<y \leq 1$). Usually, the current block layer is also preferably composed of $Al_zGa_{1-z}As$ ($0 \leq z \leq 1$), and therefore, the concentration thereof is preferably $z \geq y$. In relation with the said optical guide layer, the concentration thereof is preferably $x<y \leq z$.

Current block layer can also be composed of $In_{0.5}Ga_{0.5}P$. When the current block layer is composed of InGaP, the first etching stop layer is not necessary, because only the $Al_aGa_{1-a}As$ second etching stop layer is enough to stop etching of the $In_{0.5}Ga_{0.5}P$ current block layer and to facilitate the regrowth of the $Al_yGa_{1-y}As$ second conduction type second clad layer.

In order to realize a semiconductor laser diode with longer life, materials with not very high Al concentration should be used for layers such as the first conduction-type first clad layer (3), the second conduction-type first clad layer (5) and the second conduction-type second clad layer (8). For this reason, each of v, w and y is preferably not greater than 0.4. Further, each of v, w and y is preferably not less than 0.3 because laser diode with such a composition can achieve preferable temperature characteristic.

The structure is formed so that the effective refractive index step $\Delta n_{eff}$ between the cross-section containing the current block layer (9) and the cross-section having no current block layer satisfies the formula (I) as mentioned above. For example, in case where the second conduction-type second clad layer and the current block layer are formed with an AlGaAs-system material, it needs to accurately control the Al concentration so as to satisfy the formula (I). As a result, Al concentration z of current block layer is preferably not greater than 0.5, more preferably $0.3 \leq z \leq 0.5$.

Also, for obtaining a high kink level when the effective refractive index step $\Delta n_{eff}$ is in the range that satisfies the formula (I), the width W of the current injection region constituted by the current block layer and the second conduction-type second clad layer is usually not more than 3.5 μm, preferably not more than 2.5 μm. When W is too small, the laser may be broken before achieving a sufficient light output because of the very high light density at the laser facet. As a result, the lower limit of W is usually set at 1.0 μm, preferably 1.5 μm. The "width W of the current injection region" refers to a width of the bottom part of the current injection region, that is, the width at the boundary surface between the second conduction-type second clad layer in the current injection region and the layer underneath the second conduction-type second clad layer.

The refractive index of the second conduction-type second clad layer (8) is usually made smaller than that of the active layer (4). Also, the second conduction-type second clad layer (8) is usually identical with the first conduction-type clad layer (3) and the second conduction-type first clad layer (5). In a preferred embodiment of the present invention, all of the second conduction-type first clad layer, the second conduction-type second clad layer and the current block layer are constituted by a material of the same composition. In this case, the effective refractive index step is determined by the first etching stop layer. Even in case where the cap layer has not been completely removed, the effective refractive index step is determined by the etching stop layer plus the cap layer. This layer structure makes it possible to keep free of the problems resulting from the compositional difference at the interfaces among the said three layers.

It is preferred that a contact layer (11) is formed on the second conduction-type second clad layer (8) for the purpose of reducing contact resistivity to electrode. The contact layer (11) is usually composed of a GaAs material. This layer is usually made higher in carrier concentration than the other layers for lowering the contact resistivity with electrodes.

Usually the thickness of the buffer layer (2) is in the range of 0.1 to 1 μm, preferably 0.5 to 1 μm; the thickness of the first conduction-type clad layer (3) is in the range of 0.5 to 3 μm, preferably 1 to 2.5 μm; the thickness of one layer in the active layer is in the range of 0.0005 to 0.02 μm, preferably 0.003 to 0.02 μm, in the case of a quantum well structure; the thickness of the second conduction-type first clad layer (5) is in the range of 0.05 to 0.3 μm, preferably 0.05 to 0.2 μm; the thickness of the second conduction-type second clad layer (8) is in the range of 0.5 to 3 μm, preferably 1 to 2.5 μm; the thickness of the cap layer (10) is in the range of 0.005 to 0.5 μm, preferably 0.005 to 0.3 μm; and the thickness of the current block layer (9) is in the range of 0.3 to 2 μm, preferably 0.3 to 1 μm.

Electrodes (12) and (13) are further formed, thereby obtaining the semiconductor laser diode shown in FIG. 2. The electrode (12) is formed, in the case of p-type, by depositing suitable metals such as Ti, Pt and Au successively in order on the surface of the contact layer (11), followed by an alloy treatment. The electrode (13) is formed on the surface of the substrate (1). In the case of n-type electrode, the electrode (13) is formed by depositing suitable metals (or metal alloys) such as AuGe, Ni and Au successively in this order on the substrate surface, followed by an alloy treatment.

The obtained laser diode wafer by formation of the electrodes is cleaved into laser bars. The facets of the laser bars are asymmetrically coated usually with Si, $Al_2O_3$ or $SiN_x$ to make the reflectivity of the front facet around 3.5% and that of the rear facet around 93%. Then, the laser bars are divided into discrete chips and utilized as laser diodes (LD).

The foregoing explanation is directed to the groove-type semiconductor laser diodes, but the present invention can as well be applied to the ridge-type semiconductor laser diodes as far as the effective refractive index step falls within the range defined in the above.

The semiconductor laser diode of the present invention has realized the reconciliation of high kink level and excellent temperature characteristics by defining the effective refractive index step $\Delta n_{eff}$ in the horizontal direction and the width W of the current injection region in the specific ranges, and thus offers a great deal of industrial benefits.

EXAMPLES

The present invention is explained in more detail by showing the examples thereof, but it should be understood that these examples are merely intended to be illustrative and not to be construed as limiting the scope of the present invention.

Example 1

A groove-type laser diode shown in FIG. 2 is produced in the following way.

On an n-type GaAs substrate (1) having a carrier concentration of $1\times10^{18}$ cm$^{-3}$, the following layers are deposited successively by MBE method: a 1 μm thick n-type GaAs layer having a carrier concentration of $1\times10^{18}$ cm$^{-3}$ as buffer layer (2), a 1.5 μm thick n-type $Al_{0.35}Ga_{0.65}As$ layer having a carrier concentration of $1\times10^{18}$ cm$^{-3}$ as first conduction-type clad layer (3), then a 6 nm thick undoped $In_{0.2}Ga_{0.8}As$ active layer having a single quantum well (SQW) structure sandwiched between two 30 nm thick undoped GaAs optical guide layers, a 0.1 μm thick p-type $Al_{0.35}Ga_{0.65}As$ layer having a carrier concentration of $1\times10^{18}$ cm$^{-3}$ as second conduction-type first clad layer (5), a 10 nm thick p-type GaAs layer having a carrier concentration of $1\times10^{18}$ cm$^{-3}$ as second etching stop layer (6), a 20 nm thick n-type $In_{0.49}Ga_{0.51}P$ layer having a carrier concentration of $5\times10^{17}$ cm$^{-3}$ as first etching stop layer (7), a 0.5 μm thick n-type $Al_{0.39}Ga_{0.61}As$ layer having a carrier concentration of $5\times10^{17}$ cm$^{-3}$ as current block layer (9), and a 10 nm thick n-type GaAs layer having a carrier concentration of $1\times10^{18}$ cm$^{-3}$ as cap layer (10).

A silicon nitride mask having an opening width of 1.5 μm is deposited on the top layer excluding the current injection region. Etching is carried out with the first etching stop layer serving as an etching stopper to remove the cap layer (10) and current block layer (9) of the current injection region. Etching is conducted at 25° C. for 30 seconds with an etchant composed of a 1:1:5 (by volume) mixture of sulfuric acid (98 wt %), hydrogen peroxide (30 wt % aqueous solution) and water.

Then, the obtained structure is dipped into an etching solution composed of a 1:6 (by volume) mixture of HF (49%) and $NH_4F$ (40%) for 2 minutes and 30 seconds to remove the silicon nitride layer, followed by additional etching with the second etching stop layer serving as an etching stopper to remove the first etching stop layer of the current injection region. This etching is conducted at 25° C. for 2 minutes with an etchant composed of a 2:1 (by volume) mixture of hydrochloric acid (35 wt %) and water.

Then the p-type $Al_{0.35}Ga_{0.65}As$ layer having a carrier concentration of $1\times10^{18}$ cm$^{-3}$ is grown with a thickness of 1.5 μm at the layer buried portion (the portion of the current injection region) as the second conduction-type second clad layer (8) by MOCVD method, and finally a 3 μm thick p-type GaAs layer having a carrier concentration of $1\times10^{19}$ cm$^{-3}$ is grown as the contact layer (11) also by MOCVD method for keeping good contact with the electrodes, thereby forming a laser diode wafer. The obtained laser diode wafer is cleaved into laser bars, the facets of which are asymmetrically coated in accordance with conventional method. The reflectivity of the front facet is 3.5% and the reflectivity of the rear facet is 93%. Then, the laser bars are divided into discrete chips to form laser diodes. The width W of the current injection region, namely, the width at the boundary surface between the second conduction-type second clad layer and the second etching stop layer of this laser diode is 2.2 μm.

Figure 3:
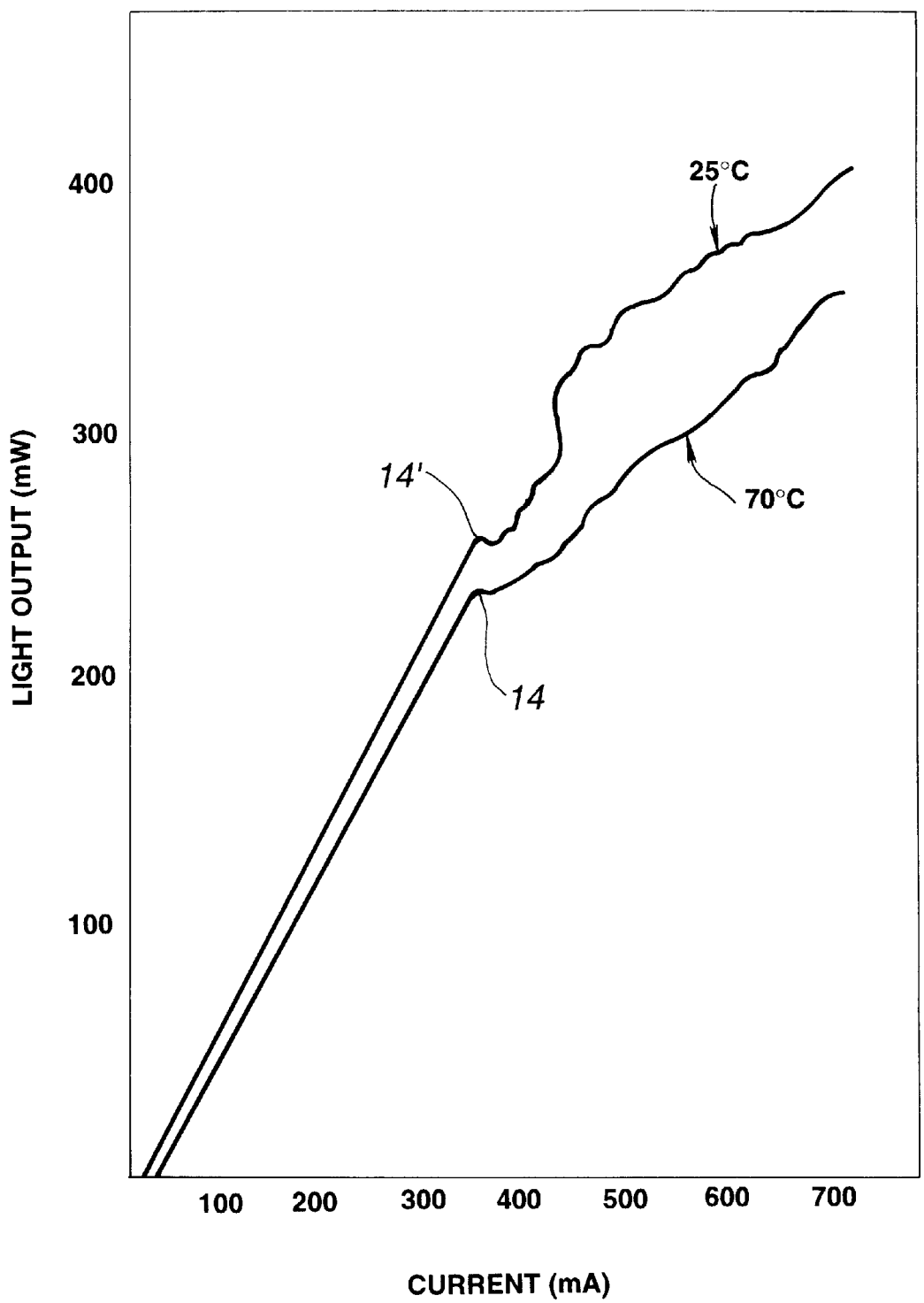
FIG. 3 is a graph showing the typical relationship between current and light output at 25° C. and 70° C. of the semiconductor laser diode in Example 1 of the present invention.

As a result of calculations, the effective refractive index step $\Delta n_{eff}$ in the horizontal direction of this laser diode is determined to be $3.71\times10^{-3}$. The typical relation between current and light output at 25° C. and 70° C. of this laser diode is shown in FIG. 3.

At 25° C., the threshold current is 22 mA and the first kink is seen at 350 mA–250 mW. At 70° C., the threshold current is 35 mA and the first kink is seen at 340 mA–240 mW.

Also, the result of Example 1 together with the results of Examples 2 and 3 and Comparative Examples 1 to 5 are shown in Table 1. In Table 1, z represents Al concentration of the $Al_zGa_{1-z}As$ current block layers. $I_{th}$ represents the threshold current. In the row of "Kink level", figures with asterisks represent catastrophic optical damage (COD) level, which means that the laser diode is broken on that point.

Example 2

Figure 4:
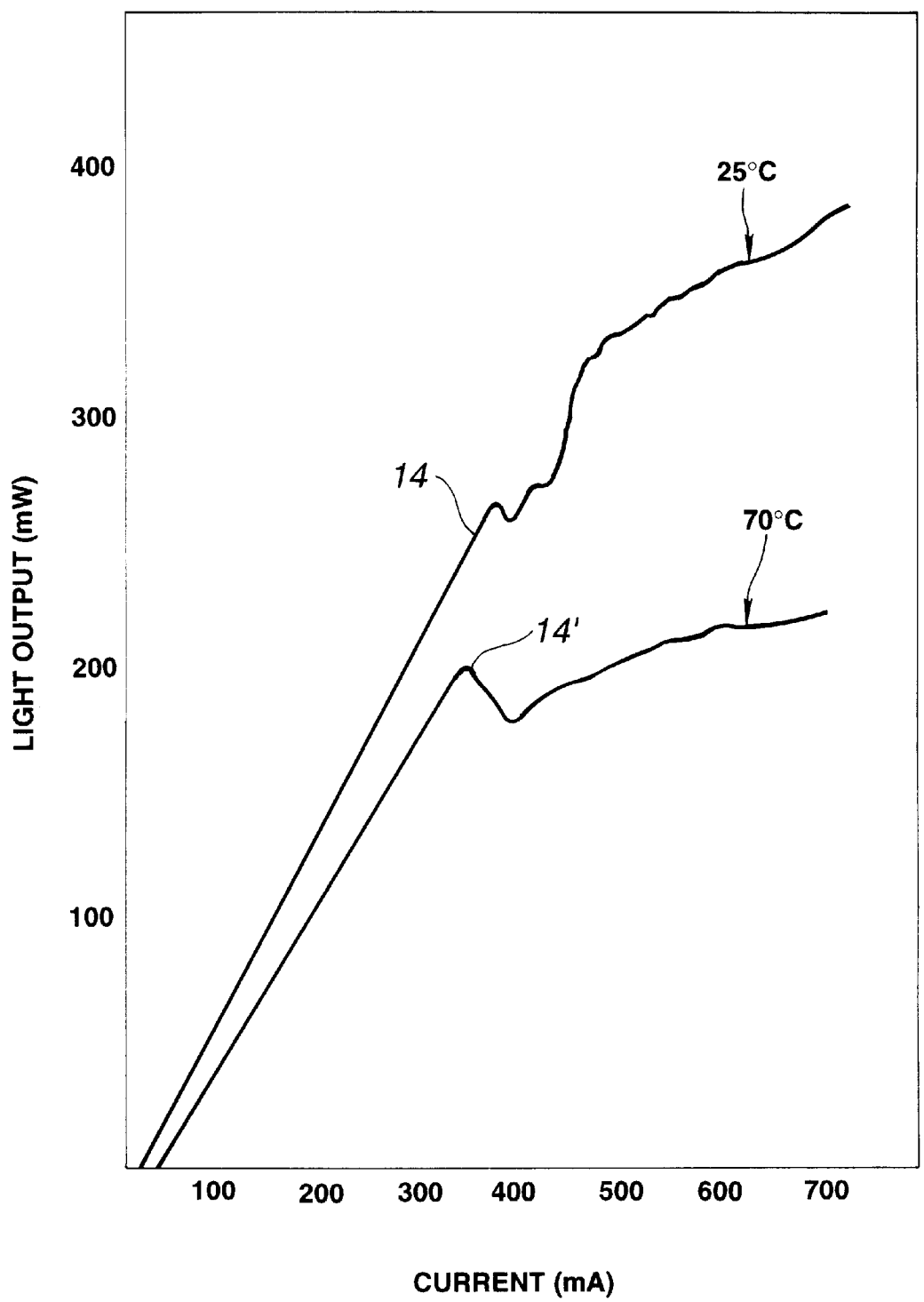
FIG. 4 is a graph showing the typical relationship between current and light output at 250° C. and 70° C. of the semiconductor laser diode in Example 2 of the present invention.

The same procedure as defined in Example 1 is carried out except that the current block layer composition is changed to $Al_{0.382}Ga_{0.618}As$ to obtain a laser diode. The typical relation between current and light output at 25° C. and 70° C. of this laser diode is shown in FIG. 4. In this case, the effective refractive index step $\Delta n_{eff}$ is $3.0\times10^{-3}$. At 25° C. the threshold current is 23 mA and the first kink is seen at 360 mA–260 mW. At 70° C., the threshold current is 37 mA and the first kink is seen at 330 mA–200 mW.

Example 3

Figure 5:
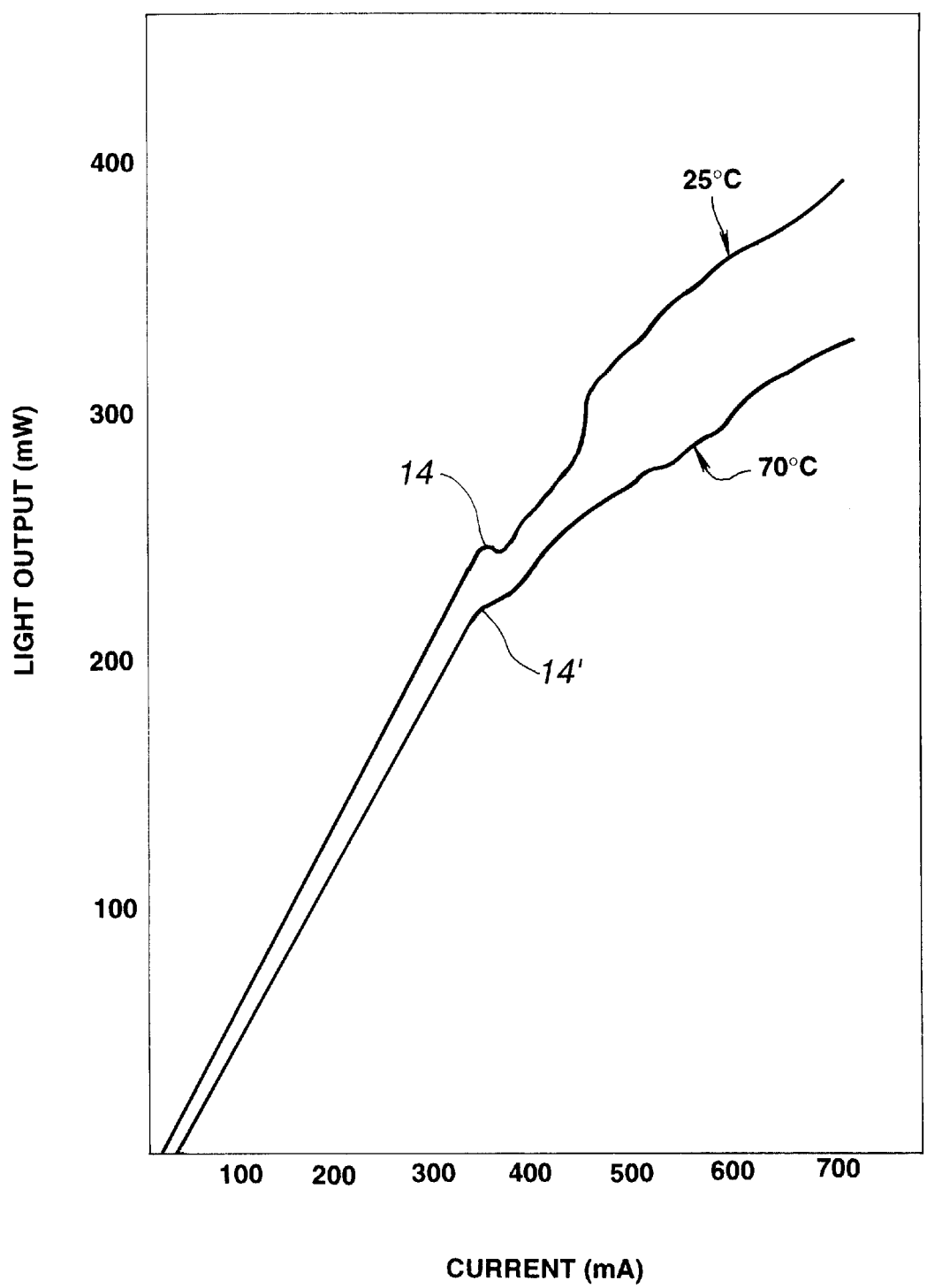
FIG. 5 is a graph showing the typical relationship between current and light output at 25° C. and 70° C. of the semiconductor laser diode in Example 3 of the present invention.

The same procedure as defined in Example 1 is carried out except that the current block layer composition is changed to $Al_{0.40}Ga_{0.60}As$ to obtain a laser diode. The typical relation between current and light output at 25° C. and 70° C. of this laser diode is shown in FIG. 5. In this case, the effective refractive index step $\Delta n_{eff}$ is $4.5\times10^{-3}$.

At 25° C. the threshold current is 21 mA and the first kink is seen at 340 mA–240 mW. At 70° C., the threshold current is 34.5 mA and the first kink is seen at 330 mA–220 mW.

Comparative Example 1

Figure 6:
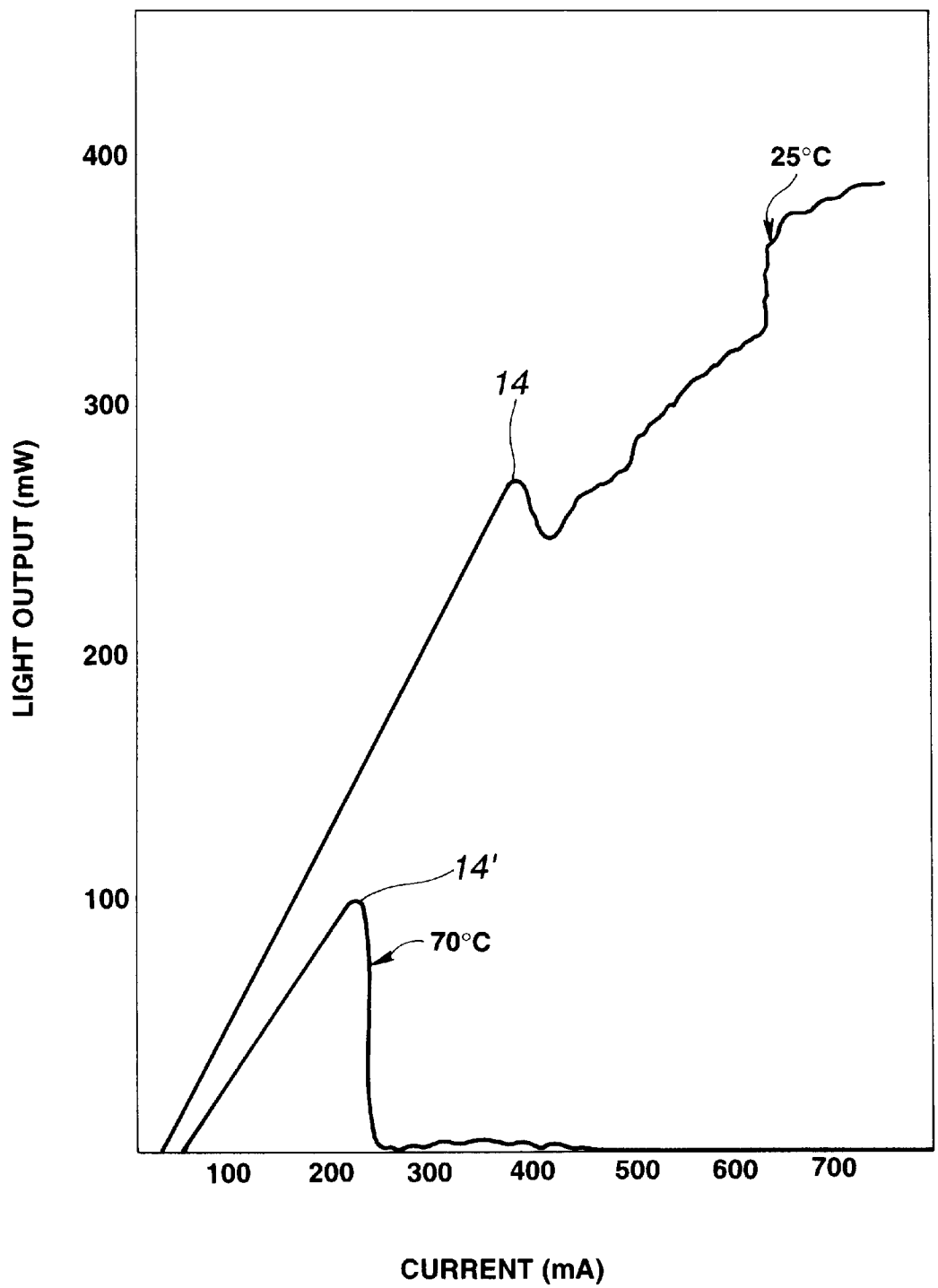
FIG. 6 is a graph showing the relationship between current and light output at 25° C. and 70° C. of the semiconductor laser diode in Comparative Example 1.

The same procedure as defined in Example 1 is carried out except that the current block layer composition is changed to Al$_{0.36}$Ga$_{0.64}$As to obtain a laser diode. The typical relation between current and light output at 25° C. and 70° C. of this laser diode is shown in FIG. 6. In this case, the effective refractive index step $\Delta n_{\it eff}$ is 5.40×10$^{-4}$.

At 25° C., the threshold current is 24 mA and the first kink is seen at 375 mA–275 mW. At 70° C., the threshold current is 40 mA and the first kink is seen at 220 mA–105 mW.

Comparative Example 2

Figure 7:
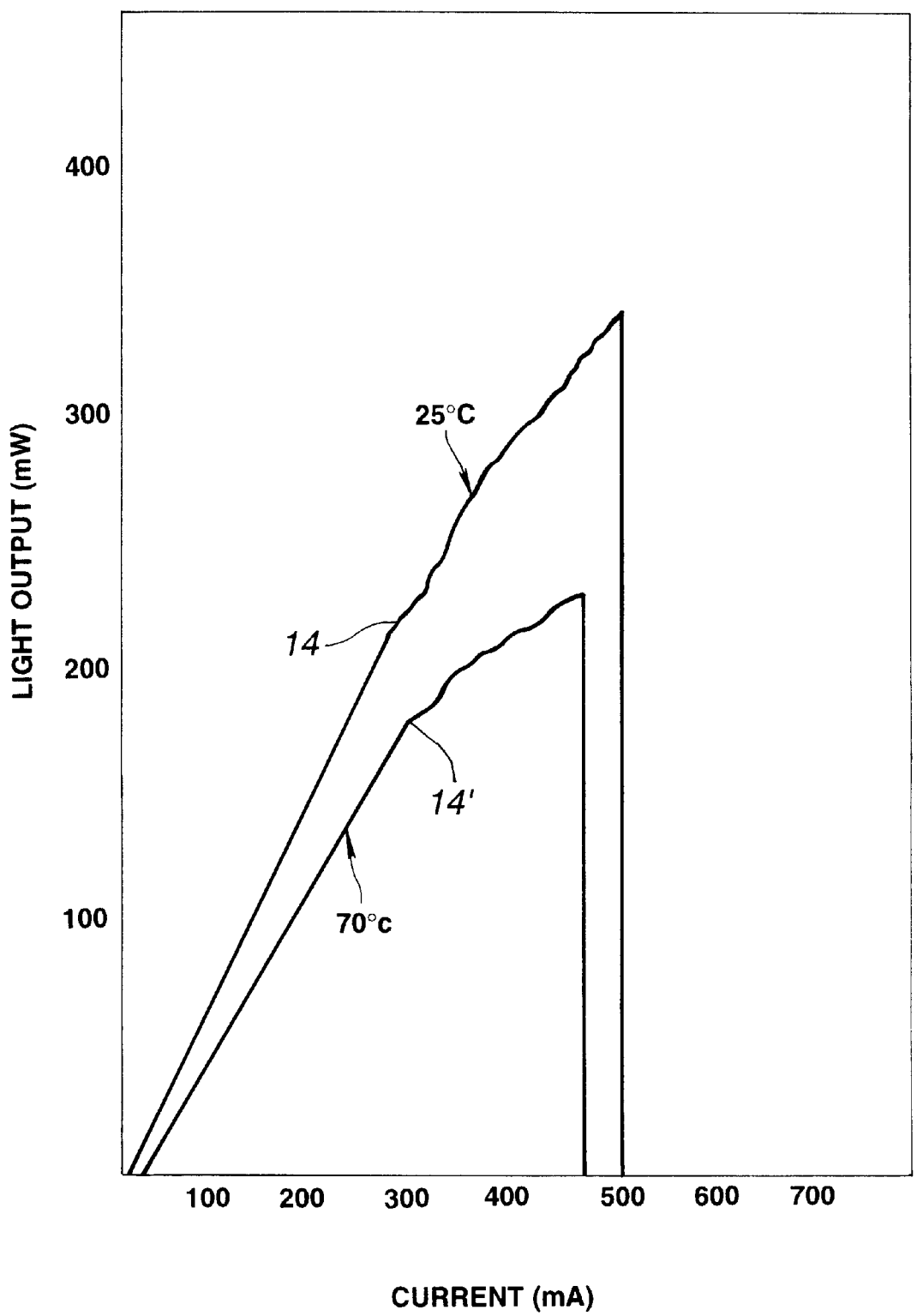
FIG. 7 is a graph showing the relationship between current and light output at 25° C. and 70° C. of the semiconductor laser diode in Comparative Example 2.

The same procedure as defined in Example 1 is carried out except that the current block layer composition is changed to Al$_{0.413}$Ga$_{0.587}$As to obtain a laser diode. The typical relation between current and light output at 25° C. and 70° C. of this laser diode is shown in FIG. 7. In this case, the effective refractive index step $\Delta n_{\it eff}$ is 5.5×10$^{-3}$.

At 25° C., the threshold current is 18 mA and the first kink is seen at 265 mA–210 mW. At 70° C., the threshold current is 33.5 mA and the first kink is seen at 290 mA–180 mW.

Comparative Example 3

Figure 8:
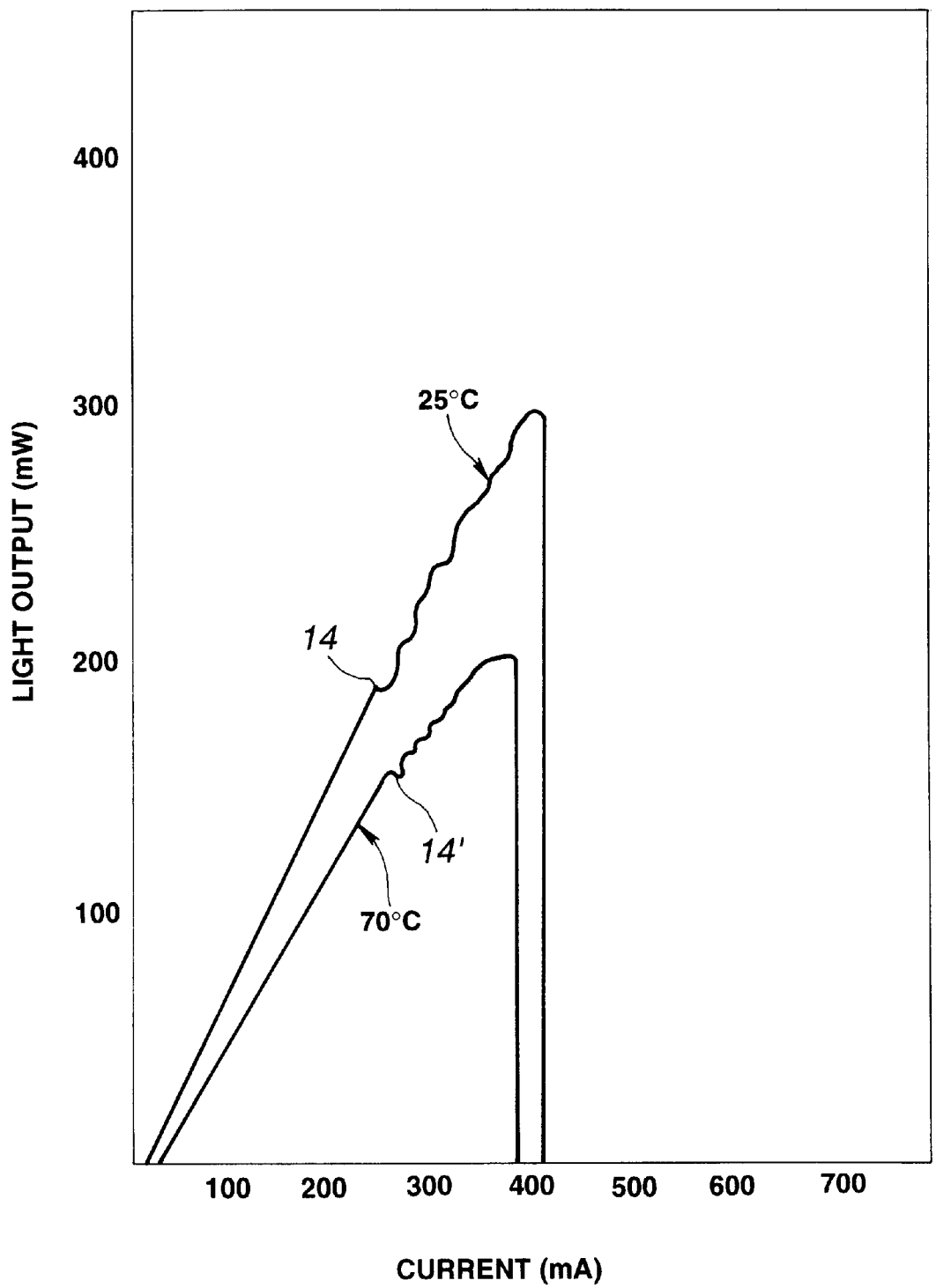
FIG. 8 is a graph showing the typical relationship between current and light output at 25° C. and 70° C. of the semiconductor laser diode in Comparative Example 3.

The same procedure as defined in Example 1 is carried out except that the current block layer composition is changed to Al$_{0.60}$Ga$_{0.40}$As to obtain a laser diode. The typical relation between current and light output at 25° C. and 70° C. of this laser diode are shown in FIG. 8. The effective refractive index step $\Delta n_{\it eff}$ of this laser diode is 1.17×10$^{-2}$.

At 25° C., the threshold current is 17 mA, the first kink is seen at 250 mA–200 mW, and the laser diode is broken down at 410 mA–300 mW. At 70° C., the threshold current is 33 mA, the first kink is seen at 260 mA–160 mw, and the laser diode is broken at 390 mA–200 mW.

Comparative Example 4

Figure 9:
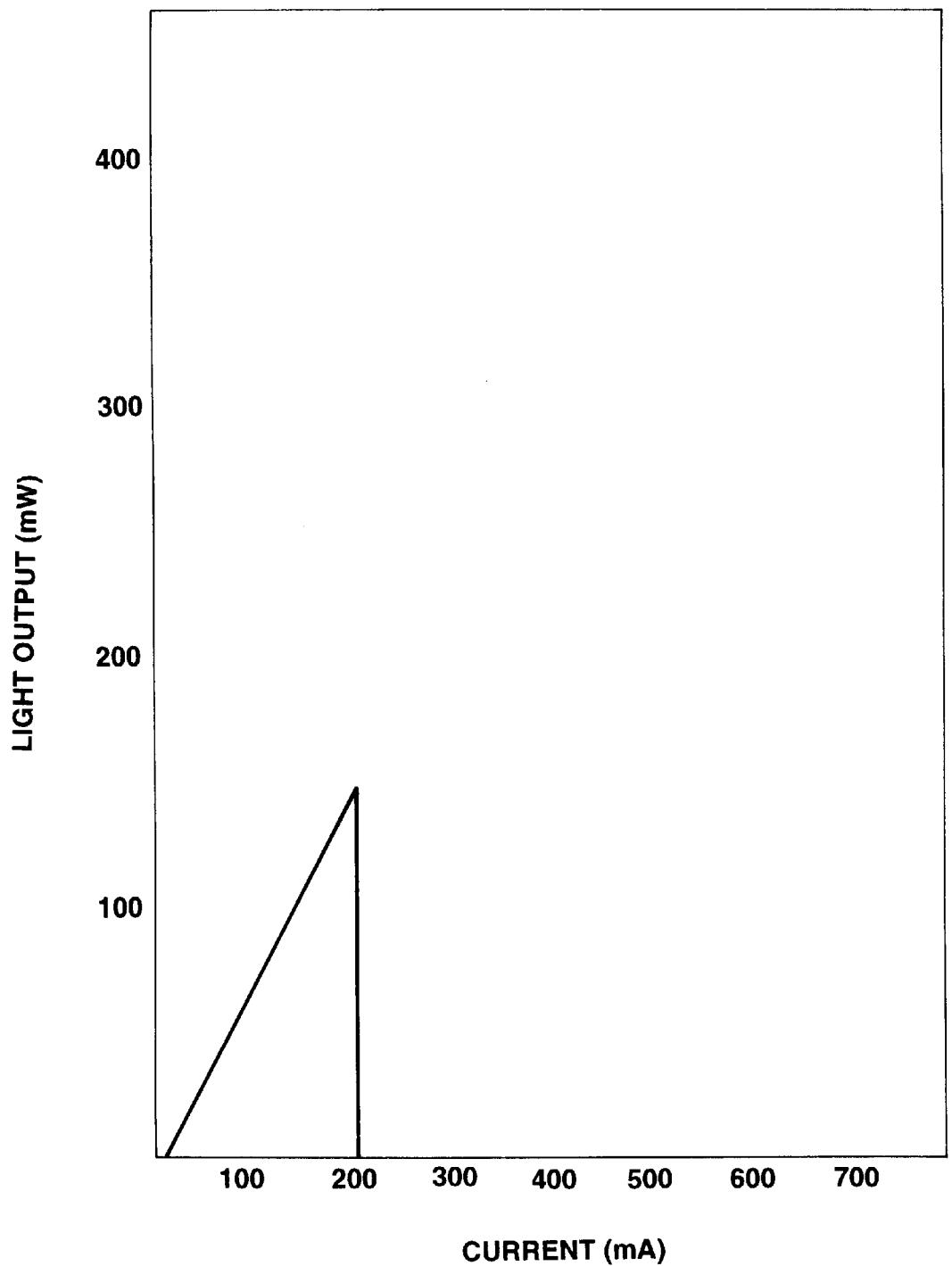
FIG. 9 is a graph showing the relationship between current and light output at 25° C. of the semiconductor laser diode in Comparative Example 4.

A laser diode is produced in the same way as defined in Example 1 except that the opening width of the silicon nitride mask is made 0.7 μm. The typical relation between current and light output at 25° C. of this laser diode is shown in FIG. 9. The width of the current injection region of this laser diode is 1.2 μm.

The threshold current is 16 mA and the laser diode is broken at 210 mA–150 mW with no kink observed.

Comparative Example 5

Figure 10:
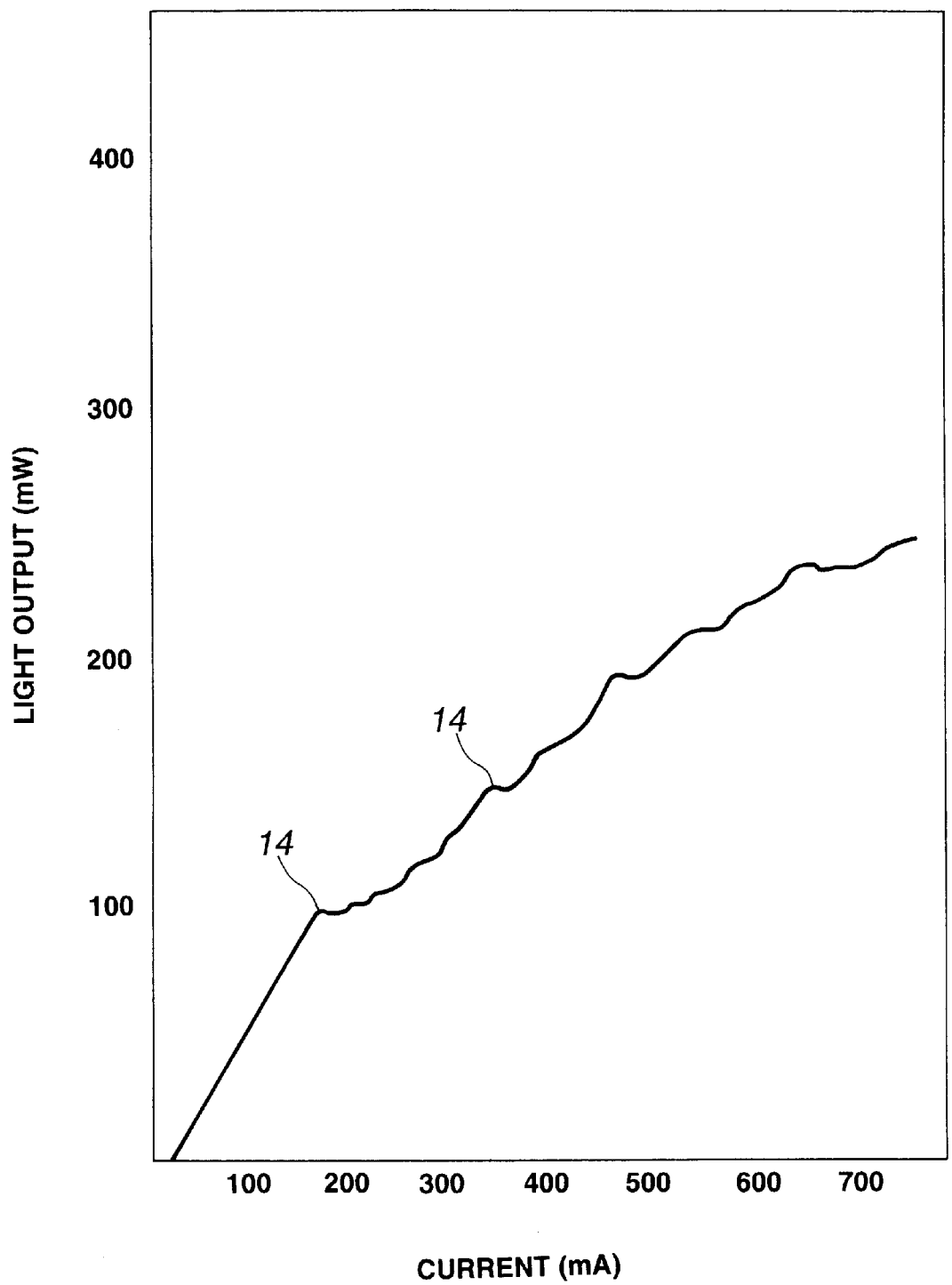
FIG. 10 is a graph showing the relationship between current and light output at 25° C. of the semiconductor laser diode in Comparative Example 5.

A laser diode is produced in the same way as in Example 1 except that the opening width of the silicon nitride mask is made 3.0 μm. The typical relation between current and light output at 25° C. of this laser diode is shown in FIG. 10. The width of the current injection region of this laser diode is 4.0 μm.

The threshold current is 30 mA and the first kink is seen at 170 mA–100 mW. Kink is also seen thereafter over several stages (at 356 mA–150 mW, etc.).

Example 4

On a Si-doped n-type GaAs substrate having a carrier concentration of 1×10$^{18}$ cm$^{-3}$, the following layers are deposited successively by MBE method: a 1 μm thick Si-doped n-type GaAs buffer layer having a carrier concentration of 1×10$^{18}$ cm$^{-3}$, a 1.5 μm thick Si-doped n-type Al$_{0.4}$Ga$_{0.6}$As first conduction-type first clad layer having a carrier concentration of 1×10$^{18}$ cm$^{-3}$, a 6 nm thick undoped In$_{0.2}$Ga$_{0.8}$As active layer having a single quantum well (SQW) structure sandwiched between two 30 nm thick undoped GaAs optical guide layers, a 0.1 μm thick Be-doped p-type Al$_{0.4}$Ga$_{0.6}$As second conduction-type first clad layer having a carrier concentration of 1×10$^{18}$ cm$^{-3}$, a 10 nm thick Be-doped p-type GaAs etching stop layer having a carrier concentration of 1×10$^{18}$ cm$^{-3}$, a 0.5 μm thick Si-doped n-type In$_{0.5}$Ga$_{0.5}$P current block layer having a carrier concentration of 1×10$^{18}$ cm$^{-3}$, a 0.1 μm thick Si-doped n-type GaAs cap layer having a carrier concentration of 1×10$^{18}$ cm$^{-3}$.

A SiNx mask as a protective layer is formed on the cap layer, and the SiNx mask is partially removed by photolithography method to form a stripe with opening width of 3.0 μm. Then, etching is carried out at 25° C. with an etchant composed of a 3:1:1 (by volume) mixture of sulfuric acid (98 wt %), hydrogen peroxide (30 wt % aqueous solution) and water to remove the cap layer selectively. Further, the current block layer is selectively etched at 25° C. with an etchant composed of a 4:1 (by volume) mixture of hydrochloric acid (36 wt %) and water to form a groove.

Then a Zn-doped p-type Al$_{0.40}$Ga$_{0.60}$As layer having a carrier concentration of 1×10$^{18}$ cm$^{-3}$ is grown by MOCVD method with a thickness of 1.5 μm both at the layer buried portion (the portion of the current injection region) and on the remaining cap layer as the second conduction-type second clad layer, and finally a 3.0 μm thick Zn-doped p-type GaAs layer having a carrier concentration of 1×10$^{19}$ cm$^{-3}$ is grown also by MOCVD method as the contact layer, thereby forming a laser diode wafer. The obtained laser diode wafer is cleaved into laser bars, the facets of which are asymmetrically coated in accordance with conventional method. The reflectivity of the front facet is 3.5% and the reflectivity of the rear facet is 93%. Then, the laser bars are divided into discrete chips to form laser diodes. The width W of the current injection region, namely, the width at the boundary surface between the second conduction-type second clad layer and the etching stop layer of this laser diode is 2.2 μm.

As a result of calculations, the effective reactive index step $\Delta n_{\it eff}$ in the horizontal direction of this laser diode is determined to be 3.7×10$^{-3}$.

At 25° C., the threshold current is 18 mA and the first kink is seen at 340 mA–250 mW. At 70° C., the threshold current is 34 mA and the first kink is seen at 320 mA–220 mW.

Also, the result of Example 4 together with the results of Comparative Examples 6 to 9 are shown in Table 2. In Table 2, y represents Al concentration of the Al$_y$Ga$_{1-y}$As second conduction-type second clad layers. I$_{th}$ represents the threshold current. In the row of "Kink level", figures with asterisks represent catastrophic optical damage (COD) level, which means at the laser diode is broken on that point.

Comparative Example 6

The same procedure as defined in Example 4 is carried out except that the second conduction-type second clad layer composition is changed to Al$_{0.415}$Ga$_{0.585}$As to obtain a laser diode. In this case, the effective refractive index step $\Delta n_{\it eff}$ is 1.0×10$^{-3}$.

At 25° C., the threshold current is 20 mA and the first kink is seen at 365 mA–270 mW. At 70° C., the threshold current is 38 mA and the first kink is seen at 270 mA–150 mW.

Comparative Example 7

The same procedure as defined in Example 4 is carried out except that the second conduction-type second clad layer composition is changed to Al$_{0.37}$Ga$_{0.63}$As to obtain a laser diode. In this case, the effective refractive index step $\Delta n_{\it eff}$ is 6.0×10$^{-3}$.

At 25° C., the threshold current is 17 mA and the first kink is seen at 240 mA–190 mW. At 70° C., the threshold current is 30 mA and the first kink is seen at 280 mA–170 mW.

Comparative Example 8

The same procedure as defined in Example 4 is carried out except that the opening width of the SiNx mask is made 1.8 μm. The width of the current injection region of this laser diode is 1.0 μm.

At 25° C., the threshold current is 16 mA and the laser diode is broken at 200 mA–155 mW.

Comparative Example 9

The same procedure as defined in Example 4 is carried out except that the opening width of the SiNx mask is made 4.8 μm. The width of the current injection region of this laser diode is 4.0 μm.

At 25° C. the threshold current is 24 mA and the first kink is seen at 160 mA–100 mW.

TABLE 1

|  |  | Comp. Ex. 1 | Ex. 2 | Ex. 1 | Ex. 3 | Comp. Ex. 2 | Comp. Ex. 3 | Comp. Ex. 4 | Comp. Ex. 5 |
|---|---|---|---|---|---|---|---|---|---|
| z |  | 0.36 | 0.382 | 0.39 | 0.40 | 0.413 | 0.60 | 0.39 | 0.39 |
| $\Delta n_{eff}$ |  | $5.40 \times 10^{-4}$ | $3.0 \times 10^{-3}$ | $3.71 \times 10^{-3}$ | $4.5 \times 10^{-3}$ | $5.5 \times 10^{-3}$ | $1.17 \times 10^{-2}$ | $3.71 \times 10^{-3}$ | $3.71 \times 10^{-3}$ |
| W (μm) |  | 2.2 | 2.2 | 2.2 | 2.2 | 2.2 | 2.2 | 1.2 | 4.0 |
| $I_{th}$ (mA) | 25° C. | 24 | 23 | 22 | 21 | 18 | 17 | 16 | 30 |
|  | 70° C. | 40 | 37 | 35 | 34.5 | 33.5 | 33 | — | — |
| Kink level | (mA) 25° C. | 375 | 360 | 350 | 340 | 265 | 250 | 210* | 170 |
|  | (mW) | 275 | 260 | 250 | 240 | 210 | 200 | 150* | 100 |
|  | (mA) 70° C. | 220 | 330 | 340 | 330 | 290 | 260 | — | — |
|  | (mW) | 105 | 200 | 240 | 220 | 180 | 160 | — | — |

(Note) *COD level

TABLE 2

|  |  | Comp. Ex. 6 | Ex. 4 | Comp. Ex. 7 | Comp. Ex. 8 | Comp. Ex. 9 |
|---|---|---|---|---|---|---|
| y |  | 0.415 | 0.40 | 0.37 | 0.40 | 0.40 |
| $\Delta n_{eff}$ |  | $1.0 \times 10^{-3}$ | $3.7 \times 10^{-3}$ | $6.0 \times 10^{-3}$ | $3.7 \times 10^{-3}$ | $3.7 \times 10^{-3}$ |
| W (μm) |  | 2.2 | 2.2 | 2.2 | 1.0 | 4.0 |
| $I_{th}$ (mA) | 25° C. | 20 | 18 | 17 | 16 | 24 |
|  | 70° C. | 38 | 34 | 30 | — | — |
| Kink level | (mA) 25° C. | 365 | 340 | 240 | 200* | 160 |
|  | (mW) | 270 | 250 | 190 | 155* | 100 |
|  | (mW) 70° C. | 270 | 320 | 280 | — | — |
|  | (mW) | 150 | 220 | 170 | — | — |

(Note) *COD level

What is claimed is:

1. A semiconductor laser diode comprising a GaAs substrate and at least a first conduction-type clad layer, an active layer containing In, Ga and As as component elements, a second conduction-type first clad layer, a current block layer and a second conduction-type second clad layer which are deposited on the substrate, wherein a current injection region is formed by said current block layer and said second conduction-type second clad layer, the effective refractive index step $\Delta n_{eff}$ in the horizontal direction is not less than $2.5 \times 10^{-3}$ and not more than $4.5 \times 10^{-3}$ at the emission wavelength, and the width W of the current injection region is from 1.5 to 2.5 μm.

2. A semiconductor laser diode according to claim 1, wherein the current block layer and the second conduction-type second clad layer contain Al, Ga and As.

3. A semiconductor laser diode according to claim 2, wherein the current block layer comprises $Al_zGa_{1-z}As$ ($0 \leq z \leq 1$), and the second conduction-type second clad layer comprises $Al_yGa_{1-y}As$ ($0 \leq z \leq 1$).

4. A semiconductor laser diode according to claim 1, wherein the emission wavelength is 900 to 1,200 nm.

5. A semiconductor laser diode according to claim 1, wherein said semiconductor laser diode is used as an excitation light source for an optical fiber amplifier.

6. A semiconductor laser diode according to claim 1, which has a ridge-type or groove-type current injection region comprising an active layer having a strained quantum well structure comprising a thin layer of the composition $In_qGa_{1-q}As$ ($0<q<1$) and an optical guide layer of the composition $Al_xGa_{1-a}As$ ($0 \leq x \leq 1$), a second conduction-type second clad layer of the composition $Al_yGa_{1-y}As$ ($0 \leq y \leq 1$) and a current block layer of the composition $Al_zGa_{1-z}As$ ($0 \leq z \leq 1$), wherein the concentration in each layer satisfies the relation: $x<y \leq z$.

7. A semiconductor laser diode according to claim 1, which has a second etching stop layer of the composition $Al_aGa_{1-a}As$ ($0 \leq a \leq 1$) and a first etching stop layer of the composition $In_bGa_{1-b}P$ ($0 \leq b \leq 1$) between the second conduction-type first clad layer and the current block layer.

8. A semiconductor laser diode according to claim 4, wherein the emission wavelength is 900 to 1,100 nm.

9. A semiconductor laser diode according to claim 1, wherein the kink level at 25° C. is not less than 240 mW.

10. A semiconductor laser diode according to claim 3, wherein z is not greater than 0.5.

* * * * *